United States Patent [19]

Little et al.

[11] Patent Number: 5,347,388

[45] Date of Patent: Sep. 13, 1994

[54] PUSH-PULL OPTICAL RECEIVER HAVING GAIN CONTROL

[75] Inventors: Frank R. Little, Alpharetta; Herman A. Kruse, Winder; John G. Megna, Lilburn; Rezin E. Pidgeon, Atlanta, all of Ga.

[73] Assignee: Scientific-Atlanta, Inc., Atlanta, Ga.

[21] Appl. No.: 753,951

[22] Filed: Sep. 3, 1991

Related U.S. Application Data

[63] Continuation-in-part of Ser. No. 481,436, Sep. 3, 1991, which is a continuation-in-part of Ser. No. 445,299, Dec. 1, 1989, Pat. No. 4,998,012.

[51] Int. Cl.$^5$ ............................................. H04B 10/06
[52] U.S. Cl. ............................... 359/189; 359/194; 250/214 A; 330/59
[58] Field of Search ................... 330/308, 59, 81–83, 330/265, 270, 271, 118, 122; 359/189, 194, 195; 250/214 A

[56] References Cited

U.S. PATENT DOCUMENTS

| | | | |
|---|---|---|---|
| 3,210,681 | 10/1965 | Rhodes | 330/32 |
| 3,296,463 | 1/1967 | Brault | 307/88.5 |
| 3,327,238 | 6/1967 | Harwood | 330/31 |
| 3,329,904 | 7/1967 | Horwitz | 330/21 |
| 3,359,502 | 12/1967 | Miura | 330/81 |
| 3,942,181 | 3/1976 | Berrod et al. | 343/16 M |
| 4,004,241 | 1/1977 | Akiyama | 330/271 |
| 4,092,610 | 5/1978 | White et al. | 330/207 |
| 4,301,543 | 11/1981 | Palmer | 455/612 |
| 4,321,552 | 3/1982 | Franssen | 330/81 |
| 4,415,803 | 11/1983 | Muoi | 250/214 |
| 4,535,233 | 8/1985 | Abraham | 250/214 |
| 4,563,656 | 1/1986 | Baum | 330/308 |
| 4,564,818 | 1/1986 | Jones | 330/311 |
| 4,609,880 | 9/1986 | Determitzakis et al. | 330/308 |
| 4,620,321 | 10/1986 | Chown | 455/619 |
| 4,641,378 | 2/1987 | McConnell et al. | 455/619 |
| 4,647,762 | 3/1987 | Chown | 250/214 |
| 4,750,216 | 6/1988 | Boyce | 455/617 |
| 4,750,217 | 6/1988 | Smith et al. | 455/619 |
| 4,752,745 | 6/1988 | Pass | 330/265 |
| 4,761,549 | 8/1988 | Mealer, III et al. | 250/214 |
| 4,771,325 | 9/1988 | Cheng et al. | 357/30 |
| 4,855,687 | 8/1989 | Herbert | 330/304 |
| 4,857,725 | 8/1989 | Goodnough et al. | 250/214 |
| 4,897,615 | 1/1990 | Chen | 330/263 |
| 4,910,477 | 3/1990 | Gross | 330/265 |
| 4,963,837 | 10/1990 | Dedic | 330/265 |
| 4,968,948 | 11/1990 | Tokumo et al. | 330/10 |
| 4,998,012 | 3/1991 | Kruse | 359/195 |
| 5,013,903 | 5/1991 | Kasper | 250/214 |
| 5,095,286 | 3/1992 | Cole et al. | 300/308 |

FOREIGN PATENT DOCUMENTS

| | | |
|---|---|---|
| 0185199 | 6/1986 | European Pat. Off. . |
| 0025333 | 1/1988 | Fed. Rep. of Germany . |
| 53-142154 | 11/1978 | Japan . |
| 56-85944 | 7/1981 | Japan . |
| 63-250928 | 10/1988 | Japan . |
| 0250928 | 10/1988 | Japan ............................ 359/189 |
| WO9112658 | 8/1991 | PCT Int'l Appl. . |

OTHER PUBLICATIONS

Millman et al, "Integrated Electronics analog and digital circuits and systems" 1972 pp. 690–691.

N. Kotera et al., "Laser Driver and Receiver Amplifiers for 2.4 Gb/s Optical Transmission Using WSi–Gate Ga As MESFET's" in GaAs IC Symposium Technical Digest 103–06 (Oct. 13, 1987).

*Primary Examiner*—Richard E. Chilcot, Jr.
*Assistant Examiner*—Kinfe-Michael Negash
*Attorney, Agent, or Firm*—Banner, Birch, McKie & Beckett

[57] ABSTRACT

A receiver is described for optical signals which are amplitude modulated with broadband radio frequency signals. The receiver includes an optical detector which receives the incoming optical signal and generates a radio frequency electrical signal which varies with the power level of the incoming optical signal. This electrical signal is applied to a pair of amplifiers which are connected in a push-pull relationship. A gain control circuit controls the gain of the amplifier pair.

10 Claims, 3 Drawing Sheets

PUSH-PULL OPTICAL RECEIVER HAVING GAIN CONTROL

RELATED APPLICATIONS

This application is a continuation-in-part application of commonly assigned application Ser. No. 07/481,436, filed Sep. 3, 1991 which is a continuation-in-part Application of commonly assigned application Ser. No. 07/445,299, filed Dec. 1, 1989, now U.S. Pat. No. 4,998,012.

FIELD OF THE INVENTION

The present invention relates to optical transmission systems and more particularly to an optical receiver having gain control for receiving optical signals amplitude modulated with wideband video signals.

BACKGROUND OF THE INVENTION

In recent years, there has been a great deal of interest in the transmission of video signals via optical fiber. This mode of signal transmission offers a number of advantages over transmitting signals over conventional 75 ohm coaxial cable as video signal distribution is now commonly accomplished in CATV systems. Optical fibers intrinsically have more information-carrying capacity than do coaxial cables. In addition, there is less signal attenuation in optical fibers than in coaxial cable adapted for carrying radio frequency signals. Consequently, optical fibers can span longer distances between signal regenerators than is possible with coaxial cable. In addition, the dielectric nature of optical fiber eliminates any problems with electrical shorting. Finally, optical fiber is immune to ambient electromagnetic interference (EMI) and generates no EMI of its own.

Amplitude modulation of an optical signal with a wideband radio frequency signal requires a light modulating device, such as a laser, which has linear characteristics of a wide dynamic range of operation.

Until recently it has been difficult to fabricate lasers in which the relationship between input current and optical output was linear over more than an extremely limited range. Because of this difficulty in obtaining lasers which were sufficiently linear to support analog amplitude modulation, digital modulation was, until recently, the primary means for transmitting information by optical signals. Digital modulation does not require a laser with a large dynamic range as do analog means for transmitting information (e.g. amplitude modulation or frequency modulation of a carrier frequency modulating the laser output). Digital modulation of the laser offers high signal quality and is also compatible with telephone trunk and feeder networks. However, because of the wideband nature of video signals digitization of these signals consumes extremely large amounts of channel capacity. A typical video signal occupies 6 Mhz of bandwidth. Transmission of this information digitally required a digital data transmission rate of approximately 45 megabits per second. High definition video (HDTV) may require a digital data transmission rate of up to 145 megabits per second. Moreover, encoders and decoders for converting analog video signals to digital form and for reconverting these digital signals to analog form for viewing on a conventional television set are quite expensive. Consequently, analog transmission of video signals is potentially much more economical than digital transmission of such signals.

Recent advances in laser technology have made analog modulation of optical signals feasible. Currently available Fabry-Perot (FP) and Distributed Feedback (DFB) lasers have sufficiently linear characteristics to allow them to be used as analog modulators of optical signals.

One such means of analog transmission is to use the baseband television signal to frequency modulate a radio frequency carrier. This modulated radio frequency carrier is in turn used to modulate an optical signal. Such frequency modulation is less susceptible to noise than is amplitude modulation but it requires more bandwidth for each television channel transmitted than are required by amplitude modulation methods. Thus, the number of television channels which can be carried by each optical transmission (e.g., each optical fiber) in an FM-based system may be somewhat limited. Moreover, since the standard NTSC format for video calls for amplitude modulation of the video carrier, means for converting FM signals to an NTSC amplitude modulated format are required either at the television receiver or at the point at which the fiber transmission trunk is connected to a coaxial cable distribution network. The need for such FM to NTSC AM conversion increases the cost of the system.

In view of the above, a system in which the video baseband signal amplitude modulates a radio frequency carrier signal which in turn amplitude-modulates an optical signal is preferable to other systems from the standpoint of cost and simplicity. However, several phenomena limit the number of radio frequency channels which can be carried by present day optical links where the intensity of light signals is amplitude modulated. A first of these phenomena is a limitation of the amount of radio frequency energy which may be supplied as a modulating signal to a laser or other light generating device before various types of distortions are generated by the light generating device. This power limitation relates to the sum of the radio frequency power contributions of each radio frequency channel. Thus, if it is desired to transmit 80 radio frequency channels over a single optical link, the power available for each channel is only half of the power which would be available if only 40 channels were transmitted by the optical link. Such a limitation on the power of each radio frequency carrier brings each of these carriers closer to the "white noise" level of the system, thus, adversely affecting the signal to noise ratio of the system. Decreasing the number of channels carried by each optical link in order to improve the signal to noise ratio increases the number of lasers which must be used and the overall complexity and cost of the system. On the other hand, increasing the amount of radio frequency power supplied to the laser beyond certain limits may cause the laser to produce several types of distortion which are discussed below.

When the modulating signal supplied to a laser causes the laser to be driven into a nonlinear portion of its input-signal-to-light-output characteristic, harmonic distortion may be produced. The products of this type of distortion are signals which are integer multiples of the "primary" frequency. The second harmonic of 54 Mhz is, for example, 108 Mhz. Thus, if the bandwidth accommodated by a system is such that there are channels at both 54 Mhz and 108 Mhz, second harmonics of the 54 Mhz channel will interfere with the signals on the 108 Mhz channel.

Intermodulation distortion is also of particular concern in amplitude modulated systems. Such distortion results in distortion products at frequencies which are the sum or difference of two other frequencies. The distortion products are the sum difference of two primary frequencies are called second order distortion products and are particularly troublesome. For example, a video channel at 150 Mhz and another video channel at 204 Mhz may produce a second order distortion product at 54 Mhz (the difference frequency) and at 354 Mhz (the sum frequency). Third order distortion products are produced by the mixing of a primary frequency with a second order distortion product. This produces third order distortion products at the sum and difference between the primary frequency and the frequency of the second order distortion product. Third order distortion products may also be generated by mixing signals at three frequencies or by third harmonic generation.

Clearly, one method of dealing with the above problems is to utilize detectors and amplifiers which are highly linear and which are thus relatively insusceptible to harmonic and intermodulation distortion. It is especially important that the production of second order distortion products be minimized. "Optical Receivers" are combinations of such detectors, and amplifiers which serve to convert amplitude modulated light to conventional broadband RF output signals comprising multi-channel video and/or data carriers. Such optical receivers should be effective over a bandwidth of approximately 50 Mhz to 550 Mhz so as to be compatible with current coaxial cable transmission technology. It is desirable that an optical receiver be effective at frequencies greater than 550 Mhz in order to accommodate additional bandwidth which may be required in future CATV systems.

Detectors for converting amplitude modulation of an optical signal to a radio frequency electrical signal corresponding to the modulation may comprise, for example, a photodiode such as the PIN-55D manufactured by PCO Inc. of Chatsworth, Calif. This type of device produces an output current corresponding to the amplitude of light applied to it.

One type of amplifier which has been used for converting the output current signal from such a photodiode to a voltage signal suitable for transmission on a conventional 75 ohm coaxial CATV cable is known as a high impedance amplifier. A generalized schematic of such a high impedance amplifier is shown in FIG. 1. The capacitor C1 of the circuit is essentially a short circuit to radio frequency signals but blocks any DC current from being transmitted. Optical energy from an optic fiber 1 is coupled through a photodiode 2 which acts as an optical power to electrical current converter. This current flows through R1 and R2 producing a corresponding radio frequency (r.f.) voltage signal at the gate of a field effect transistor ("FET") Q1. The output of the FET Q1 drives a 75 ohm coaxial cable through a capacitor C4. A problem associated with the use of such a high impedance amplifier for amplifying a broadband signal is that, at the frequencies in question, the distributed capacitance of the circuit to ground ($C_d$) coupled with the relatively high input impedance of the circuit tends to attenuate the high frequency response of the circuit ("high frequency roll- off"). Adding additional circuitry to flatten this response can degrade the performance of the circuit with respect to noise and distortion.

A type of amplifier which tends to avoid the high frequency roll-off problem associated with high impedance amplifiers is known as a transimpedance amplifier. A simplified version of such a transimpedance amplifier is shown in FIG. 2. This illustrative transimpedance amplifier is similar to the high impedance amplifier of FIG. 1 except for the addition of a feedback path comprising a resistor $R_f$ and a capacitor $C_f$ between the drain and gate of the field effect transistor Q1. A characteristic of this circuit is that its input impedance is approximately equal to $R_f$ divided by 1 plus the transconductance ($G_m$) of the circuit ($R_f/1+G_m$). Thus, depending on the selection of an appropriate resistance value for $R_f$, the input impedance of a transimpedance amplifier with a gain of 9 may be in the order of 100 ohms as compared with a similar high impedance amplifier which could have an input impedance of 3.5 kilohms or higher. This relatively low input impedance minimizes the problem of high frequency roll-off in the 50 to 550 Mhz frequency band.

Transimpedance and high frequency amplifiers are both susceptible to second order and other even and odd order distortion problems when they are used for the amplification of a high number of television carrier frequencies. In high impedance amplifiers these distortion products tend to be more severe at the low end of the frequency band. In transimpedance amplifiers the problem of second order distortion products is essentially the same throughout the band of operation.

Receiver performance as measured by carrier-to-noise ratio (CNR) and distortions, composite triple beat (CTP) and composite second order (CSO) is generally degraded by non- ideal optical signals. As the optical input power or modulation index increases, the CNR performance of the receiver generally increases, but the contribution of the receiver to the system distortion increases. Conversely, as the optical input power or modulation index decreases, the contribution of the receiver to system distortion decreases, but the C NR performance of the receiver also decreases.

If variations in optical loss occur, the optoelectronic receiver performance may be affected. If the optical loss is greater than expected, the received optical power is lower than expected. Lower than expected received optical power results in a reduced RF output from the photodetector and optoelectronic receiver. Consequently, the input level to the receiver post-amplifier is lower. This condition increases the significance of the noise contribution of the receiver post-amplifier to the system CNR. The final result may be a degradation in system CNR. If the optical loss is less than expected, the received optical power is higher than expected. This results in an increased RF output level from the photodetector and optoelectronic receiver and generally improves the system CNR. However, with the optoelectronic receiver operating at a higher output level, its contribution to the system distortion is greater. The post-amplifier is also operating at a higher level and may contribute further to the system distortion. Consequently, there may be a degradation in system distortion performance.

SUMMARY OF THE INVENTION

The present invention provides an optical receiver which is considerably more linear than previous receivers for the frequency band in question. This linearity substantially alleviates harmonic and intermodulation distortion problems experienced by previous optical receivers.

The present invention further provides an optical receiver which utilizes gain control circuitry to maintain or set an output level of the receiver.

In accordance with the present invention, the nonlinearity of the amplifier circuitry of the receiver is effectively canceled out by using a pair of matched amplifier stages connected in a push-pull configuration. Since the nonlinearities of each of these amplifier stages is relatively similar the balanced configuration of a push-pull amplifier tends to cancel out these nonlinearities and thus alleviate the problem of both even and odd harmonics and intermodulation products of the input frequencies being produced.

A gain control circuit is provided to control the gain of the amplifier circuitry. The gain control circuit is responsive to a DC control signal. The gain control may be used to maintain or set an output level of the receiver.

In a presently preferred, but nevertheless illustrative embodiment of the invention, the signals produced at the output of a photodiode are fed to the inputs of a pair of transimpedance amplifier stages. The outputs of each of these transimpedance stages feed respective high impedance buffer amplifiers. These high impedance buffer amplifiers are connected in a push-pull configuration to opposite ends of the primary winding of an output transformer. A center tap of the primary winding of the transformer is grounded through a blocking capacitor to provide a radio frequency ground. The secondary winding of the output transformer may be adapted to feed conventional 75 ohm coaxial CATV cable equipment through an optional equalization network. The amplifier stages are coupled to a gain control circuit. A DC control voltage for gain control is input on the RF output line of the receiver to the gain control circuit to vary the gain of the amplifier.

It is an object of the present invention, therefore, to provide a broadband optical receiver which is relatively insusceptible to harmonic and intermodulation distortion.

It is a further object of the present invention that the receiver have a relatively flat frequency response over a broad range of radio frequency modulation of the optical input signal.

It is still a further object of the present invention that the above receiver be implementable in discrete components so as to allow the input impedance of its amplifier to be selected in accordance with the anticipated strength of the optical signal.

It is a still further object of the present invention to provide an optical receiver whose output level remains constant over a range of input signal levels.

The above and further objects and advantages of the invention will become apparent with reference to the detailed disclosure of the invention below and the accompanying illustrative FIGURES in which.

Figure 1:
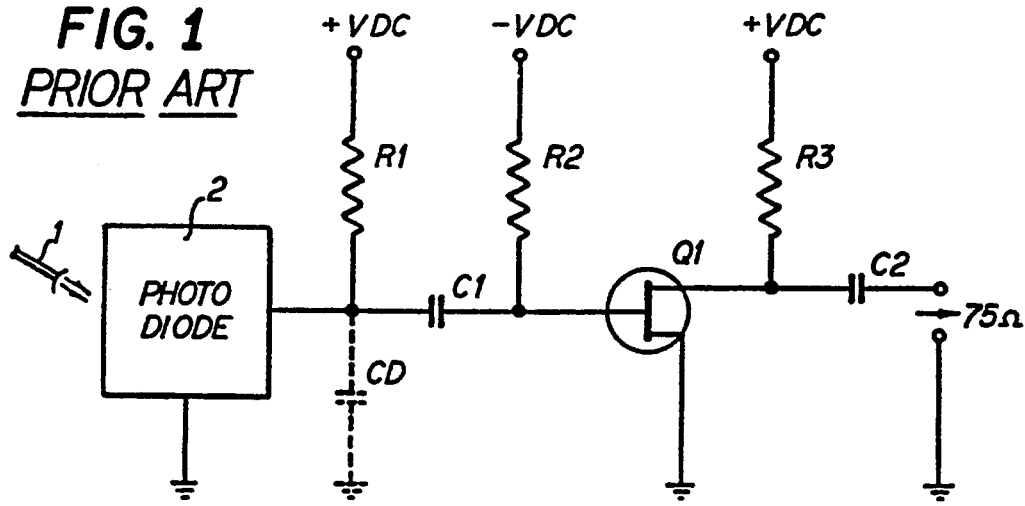
FIG. 1 is a schematic of and illustrative example of a high impedance amplifier of the prior art.
Figure 2:
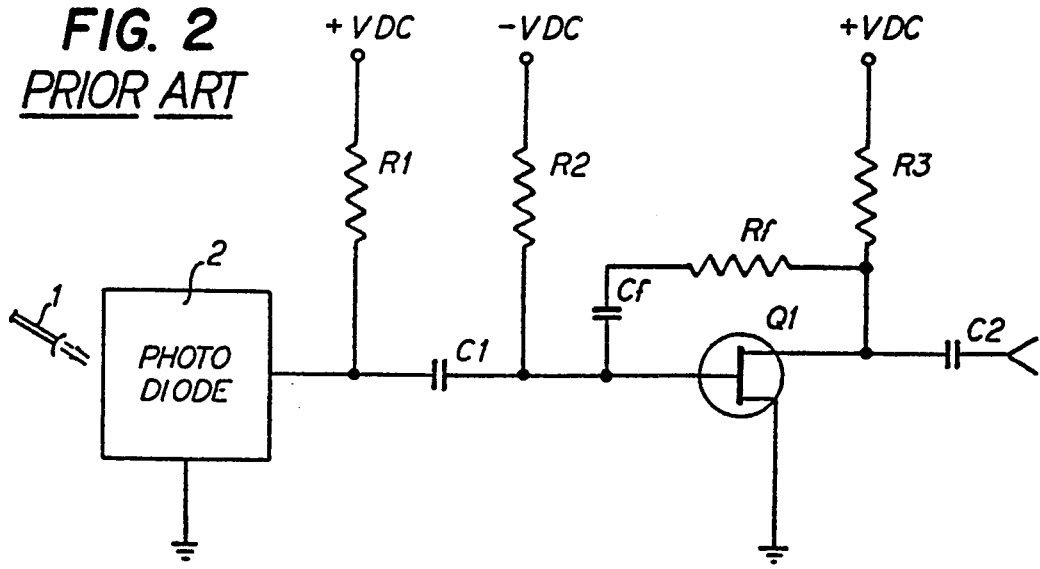
FIG. 2 is an illustrative example of a transimpedance amplifier of the prior art.
Figure 3:
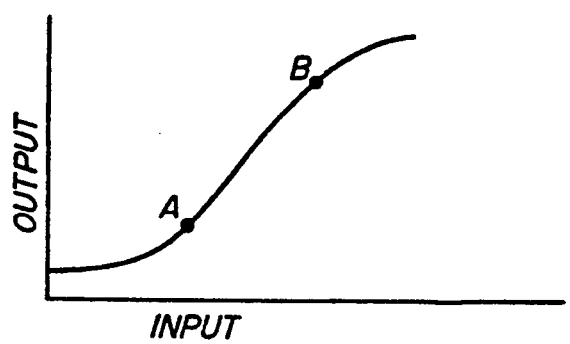
FIG. 3 is a graph showing the relationship between input voltage to output voltage in a typical single-ended amplifier.

In single-ended amplifiers of the prior art (e.g., the high impedance and transimpedance amplifiers discussed above), the distortion components which present the most serious problems are second order intermodulation products. Such second order products are formed when any two frequencies are applied at the input of the amplifier. The output signal of the amplifier will include not only the primary input frequencies but also frequency components equal to the sum and to the difference of these two input frequencies. In a broadband amplifier, these sum and/or difference frequencies may be within the frequency band of interest and thus interfere with another primary input signal. In an ideal amplifier in which there is a linear relationship between input signal and output signal, second order distortion products are not produced. However, a more realistic relationship between input voltage to output voltage in a broadband amplifier is illustrated by FIG. 3. As noted from FIG. 3 there is a linear range between the points A and B of the curve. Input signals ranging below point A or above point B result in distorted output signals. It has been found that by utilizing two amplifiers in a push-pull relationship, the nonlinearities in the input/output characteristics of the two amplifiers can be made to compensate for one another, thus, diminishing distortion due both to even and odd harmonic frequencies being produced. This arrangement has been found especially helpful for reducing second order distortion.

Figure 4:
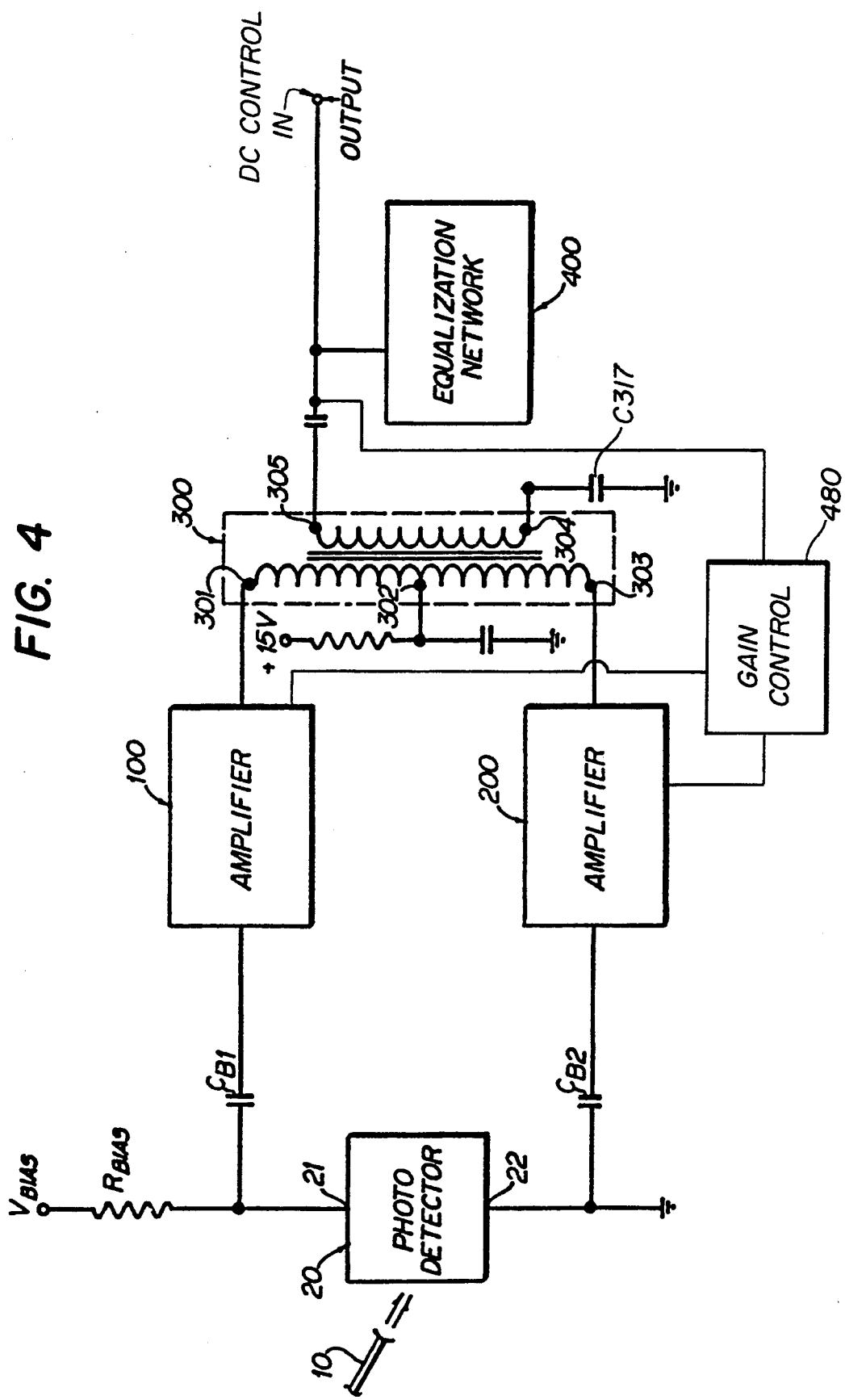
FIG. 4 is a block diagram of a broadband push-pull amplifier in accordance with the present invention.

FIG. 4 shows a simplified block diagram of a broadband optical receiver in accordance with the present invention. An optical fiber 10 carries an amplitude modulated optical signal to a photodetector 20. This photodetector may, for example, be a photodiode which is appropriately biased by a DC bias voltage ("$V_{Bias}$") applied through an appropriate biasing network comprising resistor $R_{Bias}$ to produce a DC current between terminals 21 and 22 of the photodetector when the photodetector is excited by the optical input signal. The DC current between terminals 21 and 22 includes an AC component which corresponds to the AC signal modulating the optical signal. It is typical that this AC component will range between 50 Mhz and 550 Mhz or higher. The AC component is separated from the DC signal by blocking capacitors $C_{B1}$ and $C_{B2}$ and amplified by amplifier stages 100 and 200. The outputs of the amplifiers 100 and 200 are connected to terminals 301 and 303 respectively of transformer 300 which may be a ferrite core transformer of the type commonly used in broadband r.f. applications. The primary winding of the transformer 300 is center tapped at a terminal 302 and this terminal 302 is connected through a capacitor to ground which at the frequencies in question effectively connects the center tap to ground.

Gain control circuit 480 is coupled to amplifying stages 100 and 200. A DC control signal input to gain control circuit 480 over the RF output line varies the gain of amplifying stages 100 and 200.

Optionally, a frequency response equalization network 400 may be employed at the output of the transformer 300 to help flatten out any nonlinearfries in the frequency response due to imperfections in the circuitry. Amplifiers 100 and 200 may be any type of amplifier suitable to amplifying the output of a photodiode such as a high impedance amplifier or transimpedance amplifier. Preferably, however, as set forth below in the description of the presently preferred embodiment, amplifiers 100 and 200 are of the transimpedance type.

Figure 5:
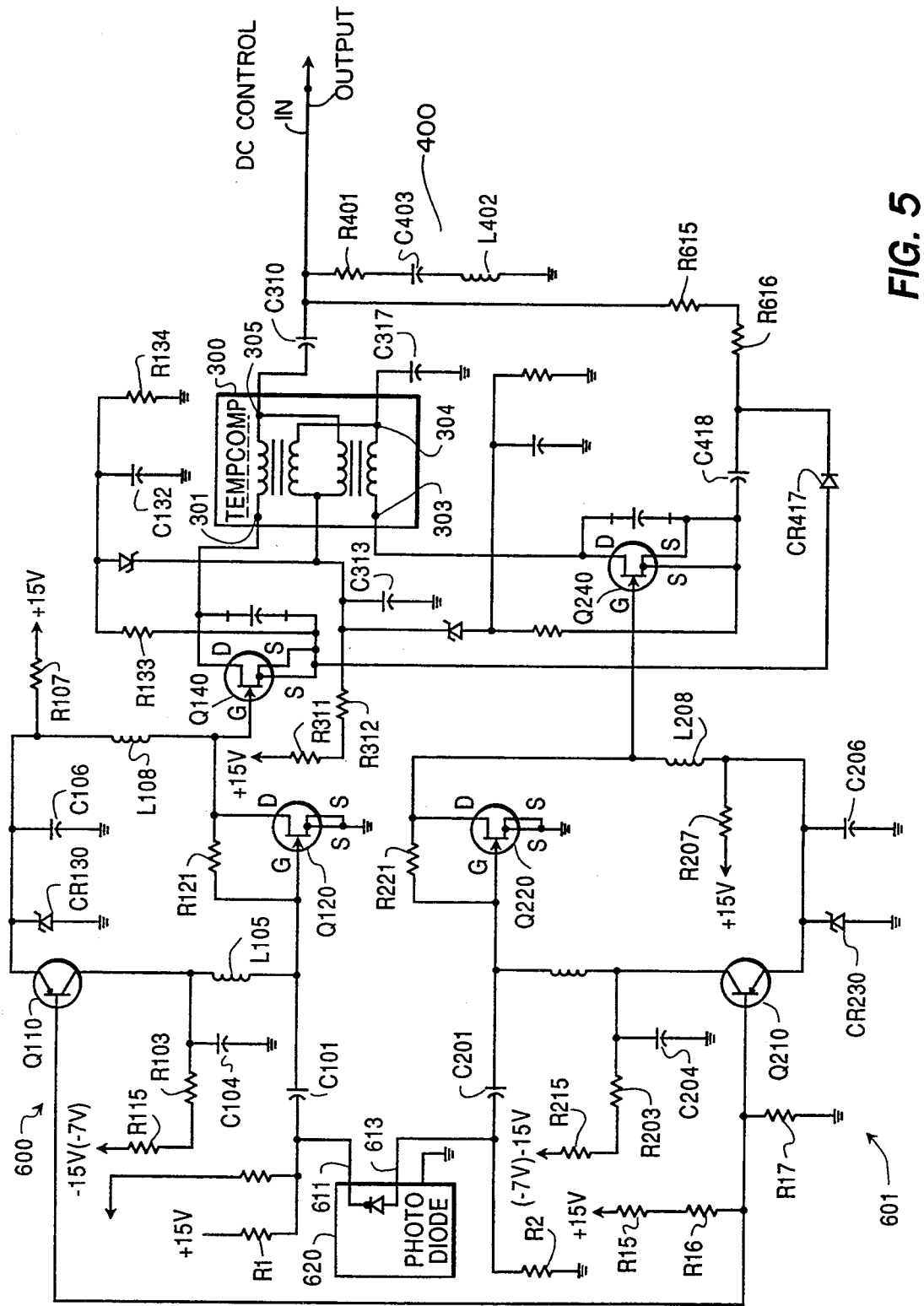
FIG. 5 is a detailed schematic of a presently preferred embodiment of the present invention.

FIG. 5 is a schematic diagram of a transimpedance receiver used with the present invention. Referring to the Figure, a photodetector, which is preferably a photodiode 620, receives an optical input signal transmitted to it an optical fiber. Cathode terminal 611 of the photodiode is connected through resistor R1 to a DC voltage which in the preferred embodiment is +15 Volts. Anode terminal 613 of the photodiode 620 is connected through a resistor R2 to ground. Terminal 611 of photodiode 620 feeds first transimpedance amplifier 600 through capacitor C101. Similarly, the other terminal 613 of photodiode 610 feeds second transimpedance amplifier 601 through blocking capacitor C201. Both of these transimpedance amplifiers 600 and 601 are configured identically, and the following description of the transimpedance amplifier 600 also applied to the transimpedance amplifier 601. In this regard it will be noted that the tens and units digits of the identification number of each component in amplifier 600 are identical to the tens and units digits of the identification numbers in corresponding components of the amplifier 601.

Transimpedance amplifier 600 is built around field effect transistor Q120, the source ("S") terminals of which are connected to ground. A feedback path is provided between the drain ("D") terminal of field effect transistor Q120 by feedback resistor R121.

The gate of field effect transistor Q120 is connected to the incoming RF signal passing through blocking capacitor C101. The DC voltage which is applied to the gate of field effect transistor Q120 is effectively controlled by a bias regulating circuit built around transistor Q110. The base of transistor Q110 is connected to ground through resistor R17 and to the +15 volt power supply through resistors R16 and R15. R15, 16 and 17 are selected to provide an input bias reference voltage to the base of transistor Q110 of approximately +3 volts. The collector of transistor Q110 is connected to ground through blocking capacitor C104 and to a −15 volt DC supply through resistors R103 and R115. The collector of transistor Q110 is also connected to the gate of field effect transistor Q120 through inductor L105. The emitter of Q110 is connected to the +15 volt DC power through resistor R107 and back to the drain of field effect transistor Q120 through an inductor L108 which is essentially an open circuit to radio frequency signals. Paths to ground from the emitter of transistor Q110 are provided by blocking capacitor C106 and a Zener diode CR130 which is normally conductible and functions to limit the source to drain voltage of Q120 during turn ON/OFF during power interruptions. Transistor Q120 is a gallium arsenide field effect transistor (GASFET) with a maximum voltage rating of 5 volts.

A feedback path is provided between the drain ("D") terminal of the field effect transistor Q120 by a feedback resistor R121. The feedback resistor R121 is a discrete component which is selected in accordance with the application into which the amplifier is to be placed. For example, if the optical fiber feeding the photodiode 620 is relatively long and the intensity of the light fed to the photodiode 620 is relatively low, correspondingly small currents will be produced by the photodiode 620. It is desirable that the output voltage of the optical receiver be independent of the intensity of the light fed to the photodetector 620. Since a small current flowing through a large impedance can produce the same voltage as a large current flowing a small impedance, it is desirable for the respective transimpedances of the transimpedance amplifiers 600 and 601 to be relatively high when these amplifiers are used to amplify signals carried by relatively small input currents. A receiver which will be driven by relatively high input currents should incorporate transimpedance amplifiers with correspondingly lower transimpedances. The transimpedance of the transimpedance ampiflier stage comprising the field effect transistor Q120 and the feedback resistor R121 is approximately equal to $R121 + V_G/1 + V_G$ where $V_{G1}$ (the voltage gain of stage 1) is equal to $G_m Z$ parallel and Z parallel is equal to $R_d$ of the GaAsFET in parallel with R121 and the loss component of L108 (which is nominally 600 ohms resistive in the frequency range of interest here). The output capacitance of Q120 is relatively small and considered to be insignificant. Thus, the transimpedance of the transimpedance amplifier stage may be varied by selecting the value of the feedback resistor R121. It will be noted that in commercially available transimpedance amplifiers packaged in integrated circuits, such selection of a feedback resistor is not easily accomplished by the end user. Where variable feedback impedances have been used the range of transimpedances available have not been great enough to compensate for the range of light intensity values to the photodetector which may occur in a CATV system using fiber optic transmission of video signals. Moreover, nonlinearires inherent in such variable feedback impedances can constitute a serious problem in the present application. Thus, the discrete and highly linear nature of the feedback resistors used in the present design offer the advantage of allowing the amplifier to be specifically adapted for an extremely broad range of varying conditions of input signals.

In accordance with the above, when weak optical signals are applied to the photodetector 620 the feedback resistor R121 may be selected to be in the range of approximately 1,000 ohms to 2 kilohms. Where strong input signals to the photodetector 20 are expected the feedback resistor R121 may be selected to be in the 200–1,000 ohm range. For extremely narrow band transmissions (e.g., transmission of only one TV channel) or for receiving a low intensity optical signal from an extremely long fiber optic path, feedback resistors of over 2 kilohms may be selected. Such resistors would also be suitable for narrowband data transmission applications.

In the above circuit, the base to emitter voltage drop across the transistor Q110 is approximately 0.7 volts. Thus, if the transistor is conducting, the voltage at the emitter of transistor Q110 will be approximately +3.7 volts.

In the above circuit, the inductor L108 is constructed to behave as short circuit to DC signals and as a pure resistive component to AC signals at the radio frequencies in question (i.e., over 50 Mhz). Preferably, L108 will appear to be a resistive impedance of approximately 600 to 700 ohms at frequencies in the 50 Mhz to 550 Mhz range. The inductor L108 may be formed of five turns of #30 enamel wire.

The drain terminal of field effect transistor Q120 is connected to terminal 301 at the primary winding of output transformer 300 via a high impedance buffer amplifier stage. This buffer amplifier stage includes a transistor Q140 whose sources are connected to ground through resistor R133 and resistor R134. A radio frequency path to ground is provided form a point in the circuit between resistor R133 and R134 by blocking capacitor C132. The drain of transistor Q140 is connected to terminal 301 at the primary winding of the output transformer 300 and the gate of transistor Q140 is connected to the drain terminal of field effect transistor Q120.

The output transformer 300 is a ferrite core transformer which is similar to the type commonly used for broadband amplifier applications. The terminal 303 at the primary winding of the output transformer is connected to the output of the other transimpedance amplifier 501. The center tap terminal 302 at the primary winding is connected to the +15 volt power supply through resistors R312 and R311 and to ground through blocking capacitor C313. The transformer 300 preferably has a 2 to 1 turns ratio or a 4 to 1 impedance ratio. The transformer 300 acts to transform the unbalanced load impedance at its output terminals 305 and 304 to a balanced load for the drains of transistors Q140 and Q240. The circuitry connected to the center tap terminal 302 of the primary winding of the transformer provides an AC short to ground at that point and also a path for the DC bias voltage to the drain of transistor Q140.

Blocking capacitor C317 provides a path from terminal 304 to ground for RF signals, and blocking capacitor C310 provides a path for the radio frequency signal to the output terminals of the receiver. The output of the receiver may, optionally, be connected to equalization network 400 comprising resistor 401 connected in series to comparator C403 which in turn is connected through resonating inductor L402 to ground. The equalization network 400 is utilized to correct for out any nonlinearities in the response of the receiver caused by imperfections in the remainder of the circuitry.

The transimpedance receiver of the present invention also includes automatic gain control circuitry. A DC control voltage is input on the RF output line. Capacitor C310 prevents the DC voltage from affecting the RF output transistors Q140 and Q240. The DC voltage serves to bias pin diode CR417 through resistors R615 and R616. Pin diode CR417 AC couples (due to the presence of capacitor C418) the sources of output FETs Q140 and Q240. When diode CR 417 is OFF and offers a high impedance, it has no effect and the transimpedance receiver operates at maximum gain. As diode CR 417 turns ON when the DC control voltage increases, diode CR417 appears as a lower impedance and the degeneration in the shunt leg of transistors Q140 and Q240 increases, i.e., the gain of transistors Q140 and Q240 is decreased. The output level may thus be varied by varying the gain of the output transistors Q140 and Q240 through varying the bias of diode CR417.

The control voltage may be generated in a number of ways. A comparison of the output level of the receiver with a desired output level can provide a control voltage for adjusting gain of the amplifiers to maintain the desired output level. Alternatively, the control voltage can be provided by manual adjustment of a potentiometer to set a desired output. The control voltage can also be provided as described in a commonly assigned application entitled "Signal Level Control in a Fiber Communications System" Ser. No. 07/754,029 now U.S. Pat. No. 5,267,071.

The circuit illustrated by FIG. 5 operates in the following manner. Optical energy is transmitted to the photodiode detector 620 via the optical fiber. The photodiode 620 is reversed biased by the biasing network comprising resistors R2 and R1. This reverse bias ensures that the photo diode 620 operates in its most linear region (i.e., in the region between point A and point B of FIG. 3). In the presence of light from the optical fiber 10 the current flowing through the photodiode 620 is determined by the responsivity of the photodiode 20 and the incident optical power applied to the input of the photodiode. This current will typically range between approximately 50 and 1,000 microamperes. When there is r.f. modulation of the amplitude of the light carried by fiber 10, the DC current through the photodiode will also have r.f. amplitude component corresponding to the degree of amplitude modulation of the light from fiber 10. This r.f. component, which comprises the carrier frequencies of the video signals transmitted over the optical fiber 10, flows through the low impedance radio frequency path provided by blocking capacitors C101 and C201 and thereby to the gate circuits of field effect transistors Q120 and Q220 of the respective transimpedance amplifiers 600 and 601. As indicated above, the feedback resistors R121 and R221 of the respective transimpedance amplifiers 600 and 601 are selected to provide input impedances which are suitably matched to the input signals to the transimpedance amplifiers 600 and 601 produced by the photodiode 620. When the fiber optic path 10 is long and the light intensity at its output to photodiode 620 is low, thus resulting in photodiode 620 providing a relatively low level input signal To the transimpedance amplifier 600 and 601, relatively high resistance values (e.g., in a range of 1,000 to 2,000 ohms) are selected for the values of R121 and R221. For applications in which relatively high input signals to the transimpedance amplifiers are expected to be generated by the photodetector 620, relatively low resistance values (e.g., in the range of 200 to 1,000 ohms) are selected for R121 and R221.

Q110 and Q210 and their associated circuitry provide bias regulation for the transimpedance amplifiers 600 and 601 respectively. They control the voltage which is applied to the gates of the field effect transistors Q120 and Q220 and regulate the drain to source current flow. For optimum linearfry it is preferable to hold the drain current flow to a range of approximately 25 milliamps d.c. Referring to the transimpedance amplifier 600, for example, this regulation of current flow is accomplished in the following manner. The transistor Q110 has an input reference voltage which is derived from the +15 volt power supply by the resistor network comprising resistors R15, R16 and R17. The emitter to base voltage drop across transistor Q110 is approximately 0.7 volts. Thus, when transistor Q110 is conducting and the voltage at the resistor R107 and inductor L108 is approximately 4 volts, L108 functions to minimize the r.f. load admittance on the drain of Q120 thereby preserving the available voltage gain of Q110. L108 also provides a low d.c. resistance path for the drain current of Q120.

A zener diode CR130 connected, between the emitter of Q110 and ground facilitates the process of applying or removing power from the circuitry illustrated in FIG. 5. CR130 does not function during normal operation (i.e., it appears to be an open circuit). While power is being turned on or off, however, CR130 acts as a voltage limiter to prevent the drain voltage of GaAsFET Q120 from exceeding the rated voltage (5v. nominal). Exceeding the rated voltage could cause damage to GaAsFET Q120.

The magnitudes of the respective output signals of field effect transistors Q120 and Q220 are determined by the input currents applied to these transistor circuits multiplied by the circuit transimpedance, which as explained above, follow the value of the respective feedback resistors R121 and R221. The r.f. voltage signals at the drains of transistors of Q120 and Q220 are fed respectively to the buffer amplifiers formed by Q140 and Q240 and their associated circuitry. The outputs of these buffer amplifiers are applied to the primary winding of output transformer 300.

The output transformer 300 is set up in a balanced configuration which is required for a push-pull amplifier application. It serves to match the output of the buffer amplifier stages to a conventional coaxial cable system for further distribution to homes connected to the coaxial cable system.

While there have been described above the principles of the present invention in conjunction with specific apparatus, it is to be clearly understood that this description is made only by way of example and not as a limitation to the scope of the invention.

We claim:

1. An optical receiver circuit for an incoming optical signal having broadband radio frequency amplitude modulation, said circuit comprising:
    an optical detector for receiving said optical signal and generating therefrom an electrical signal which varies with the optical signal power level;
    first means for amplifying said electrical signal;
    second means for amplifying said electrical signal;
    said first amplifying means and said second amplifying means each comprising a transimpedance amplifier stage including a first field effect transistor having a gate terminal, a drain terminal and a source terminal, each of said gate terminals being connected to a terminal of said optical detector and each drain terminal being connected to the gate terminal of the same field effect transistor through a selectable feedback resistor;
    means for coupling said first amplifying means and said second amplifying means in a push-pull relationship;
    said first amplifying means and said second amplifying means each further comprising a high impedance buffer amplifier stage having an input terminal connected to the drain terminal of its respective transimpedance amplifier stage and an output terminal connected to a terminal of said push-pull coupling means;
    a gain control circuit responsive to a control signal for varying a gain of said first amplifying means and second amplifying means; and
    wherein the high impedance buffer amplifier stages of said first and second amplifying means each comprise a second field effect transistor having a drain terminal connected to a terminal of said push-pull coupling means, a gate terminal connected to the drain terminal of said first field effect transistor and a source terminal connected to said gain control circuit.

2. An optical receiver in accordance with claim 1 wherein said gain control circuit comprises a pin diode.

3. An amplifier adapted to amplify a signal generated by an optical detector which varies with an optical signal power level applied to the detector, said amplifier comprising:
    first means for amplifying said signal;
    second means for amplifying said signal;
    said first amplifying means and said second amplifying means each comprising a transimpedance amplifier stage including a field effect transistor having a gate terminal, a drain terminal and a source terminal, each of said gate terminals being connected to an input terminal of said amplifier and each drain terminal being connected to the gate terminal of the same field effect transistor through a selectable feedback resistor;
    means for coupling said first amplifying means to said second amplifying means in a push-pull relationship;
    said first amplifying means and said second amplifying means each further comprising a high impedance buffer amplifier stage having an input terminal connected to the drain terminal of the respective transimpedance amplifier stage and an output terminal connected to a terminal of said push-pull coupling means;
    a gain control circuit responsive to a control signal for varying the gain of said first and second amplifying means; and
    wherein the high impedance buffer amplifier stages of said first and second amplifying means each comprise a second field effect transistor having a drain terminal connected to a terminal of said push-pull coupling means, a gate terminal connected to the drain of said first field effect transistor and a source terminal connected to said gain control circuit.

4. An optical receiver in accordance with claim 3 wherein said gain control circuit comprises a pin diode.

5. An optical receiver circuit for an incoming optical signal having broadband radio frequency amplitude modulation, said circuit comprising:
    an optical detector for receiving said optical signal and generating therefrom an electrical signal which varies with the optical signal power level;
    first means for amplifying said electrical signal;
    second means for amplifying said electrical signal;
    said first amplifying means and said second amplifying means each comprising a transimpedance amplifier stage including a first field effect transistor having a gate terminal, a drain terminal and a source terminal, each of said gate terminals being connected to a terminal of said optical detector and each drain terminal being connected to the gate terminal of the same field effect transistor through a selectable feedback resistor;
    means for coupling said first amplifying means and said second amplifying means in a push-pull relationship; and
    a gain control circuit responsive to a control signal for varying a gain of said first amplifying means and second amplifying means.

6. An optical receiver in accordance with claim 5 wherein said first amplifying means and said second amplifying means each further comprise:
    a high impedance buffer amplifier stage having an input terminal connected to the drain terminal of its respective transimpedance amplifier stage and an output terminal connected to a terminal of said push-pull connecting means.

7. An optical receiver in accordance with claim 6 wherein said push-pull connecting means comprises a transformer including:
    a primary winding having a first terminal at one end thereof connected to the output terminal of said first amplifying means, a second terminal at the other end thereof connected to the output terminal of said second amplifying means and a third terminal connecting an intermediate section of said secondary winding to ground through a DC blocking capacitor; and a secondary winding having output terminals adapted for connection to a CATV coaxial cable.

8. An amplifier adapted to amplify a signal generated by an optical detector which varies with an optical signal power level applied to the detector, said amplifier comprising:

first means for amplifying said signal;

second means for amplifying said signal;

said first amplifying means and said second amplifying means each comprising a transimpedance amplifier stage including a field effect transistor having a gate terminal, a drain terminal and a source terminal, each of said gate terminals being connected to an input terminal of said amplifier and each drain terminal being connected to the gate terminal of the same field effect transistor through a selectable feedback resistor;

means for coupling said first amplifying means to said second amplifying means in a push-pull relationship; and a gain control circuit responsive to a control signal for varying a gain of said first and second amplifying means.

9. The amplifier of claim 8 wherein said first amplifying means and said second amplifying means each further comprise:

a high impedance buffer amplifier stage having an input terminal connected to the drain terminal of the respective transimpedance amplifier stage and an output terminal connected to a terminal of said push-pull connecting means.

10. The amplifier of claim 9 wherein said push-pull connecting means comprises a transformer including:

a primary winding having a first terminal at one end thereof connected to the output terminal of said first amplifying means, a second terminal at the outer end thereof connected to the output terminal of said second amplifying means, and a third terminal connecting an intermediate portion of said secondary winding to ground through a DC blocking capacitor; and a secondary winding having output terminals adapted for connection to a CATV coaxial cable.

* * * * *